(12) United States Patent
Thompson et al.

(10) Patent No.: US 7,233,207 B2
(45) Date of Patent: Jun. 19, 2007

(54) SYSTEM AND METHOD FOR PROVIDING AN INPUT TO A DISTRIBUTED POWER AMPLIFYING SYSTEM

(75) Inventors: Bruce M. Thompson, Boca Raton, FL (US); Robert E. Stengel, Pompano Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 113 days.

(21) Appl. No.: 11/123,309

(22) Filed: May 6, 2005

(65) Prior Publication Data
US 2006/0250189 A1    Nov. 9, 2006

(51) Int. Cl.
*H03F 3/60* (2006.01)
(52) U.S. Cl. .................... 330/286; 330/54; 330/295
(58) Field of Classification Search .......... None
See application file for complete search history.

(56) References Cited

U.S. PATENT DOCUMENTS 6,667,659 B2 * 12/2003 Stengel et al. .............. 330/286

* cited by examiner

*Primary Examiner*—Khanh Van Nguyen

(57) ABSTRACT

A system and a method for providing an input to a distributed power amplifying system are provided. In an embodiment, a distributed power amplifying system includes a plurality of amplifying sections (102, 104, 106, and 108) and a plurality of drivers (110, 112, 114, and 116). Each of the plurality of drivers receives a common transmit signal (118) and an individual control signal (120, 122, 124, and 126). Each of the plurality of drivers independently preconditions the common transmit signal, to provide a transmit output signal (128, 130, 132, and 134) to each of the plurality of amplifying sections. The common transmit signal provided to each of the plurality of drivers is preconditioned, based on the individual control signal.

14 Claims, 5 Drawing Sheets

SYSTEM AND METHOD FOR PROVIDING AN INPUT TO A DISTRIBUTED POWER AMPLIFYING SYSTEM

FIELD OF THE INVENTION

The present invention relates to the field of distributed power amplifying systems. In particular, the present invention relates to drivers that provide inputs to different amplifying sections of the distributed power amplifying systems.

BACKGROUND OF THE INVENTION

A distributed power amplifying system produces an output by successively collecting the contributions of different amplifying sections along a transmission line, typically a uniform transmission line. In a conventional distributed power amplifying system, a single driver provides input signals to the different amplifying sections of the distributed power amplifying system. The input to the single driver is a signal represented by m(t). The single driver generates a plurality of signals $S_1(t)$, $S_2(t)$ ..., and $S_N(t)$ from m(t). The plurality of signals $S_1(t)$, $S_2(t)$, ..., and $S_N(t)$ drive the various amplifying sections (1, 2, ..., N) of the distributed power amplifying system.

The number of signals (N) generated by the driver depends on the number of amplifying sections of the distributed power amplifying system. When the number of amplifying sections of the distributed power amplifying system increases or decreases, the single driver is subject to input loading effects which limit the number of usable sections.

Moreover, the plurality of signals $S_1(t)$, $S_2(t)$ ..., and $S_N(t)$ generated by the driver are correlated. The noise in the plurality of signals $S_1(t)$, $S_2(t)$ ..., and $S_N(t)$ is also correlated because of the correlation between the signals $S_1(t)$, $S_2(t)$ ..., and $S_N(t)$.

Accordingly, there is a need for an improved apparatus and method for providing the plurality of signals $S_1(t)$, $S_2(t)$ ..., and $S_N(t)$ to the different amplifying sections of the distributed power amplifying system.

BRIEF DESCRIPTION OF THE FIGURES

The present invention is illustrated by way of example, and not limitation, in the accompanying figures, in which like references indicate similar elements, and in which.

Figure 1:
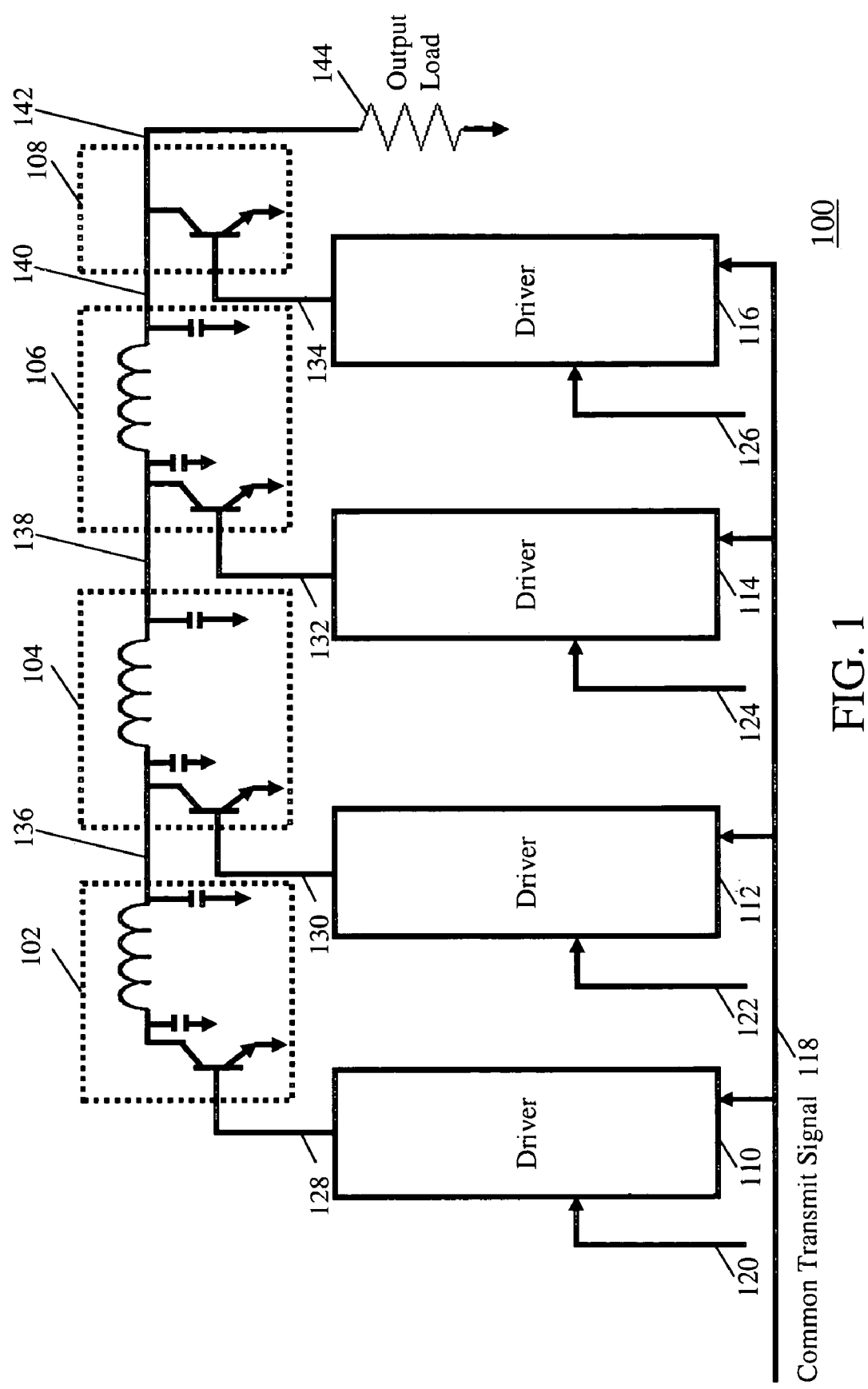
FIG. 1 is a block diagram illustrating a distributed power amplifying system, in accordance with various embodiments of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

In an embodiment, a distributed power amplifying system includes a plurality of amplifying sections and a plurality of drivers. Each of the plurality of drivers receives a common transmit signal and an individual control signal. Each of the plurality of drivers independently preconditions the common transmit signal to provide a transmit output signal to each of the plurality of amplifying sections. The common transmit signal provided to each of the plurality of drivers is preconditioned, based on the individual control signal.

In another embodiment, a method for preconditioning a common transmit signal, provided to a distributed power amplifying system, is given. To precondition the common transmit signal, the common transmit signal is acquired by a driver. After this, the common transmit signal is preconditioned by a plurality of independently controlled drivers, to produce a transmit output signal. Further, the transmit output signal produced by each driver is provided to an amplifying section of the distributed power amplifying system.

Before describing in detail a method and system for providing an input to the amplifying sections of the distributed power amplifying system, in accordance with the present invention, it should be observed that the present invention resides primarily in combinations of method steps and system components related to the amplifying system. Accordingly, the apparatus components and method steps have been represented, where appropriate, by conventional symbols in the drawings. These drawings show only the specific details that are pertinent for understanding the present invention, so as not to obscure the disclosure with details that will be apparent to those with ordinary skill in the art and the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Various embodiments of the present invention provide a system and a method for preconditioning a common transmit signal, to produce a transmit output signal. The transmit output signal is provided to an amplifying section of a distributed power amplifying system. In accordance with an embodiment of the present invention, the common transmit signal is preconditioned by adjusting its phase and amplitude, based on a control signal provided to a driver.

FIG. 1 is a block diagram illustrating a distributed power amplifying system 100, in accordance with various embodiments of the present invention. The amplifying system includes a plurality of amplifying sections (for example, an amplifying section 102, an amplifying section 104, an amplifying section 106, and an amplifying section 108), a plurality of drivers (for example, a driver 110, a driver 112, a driver 114, and a driver 116), and an output load 144. While shown with bipolar transistors, the amplifier sections can comprise any active device and delay network.

The driver 110, the driver 112, the driver 114, and the driver 116 independently precondition a common transmit signal 118, based on individual control signals 120, 122, 124, and 126 received. As shown in FIG. 1, the driver 110 receives a control signal 120, the driver 112 receives a control signal 122, the driver 114 receives a control signal 124, and the driver 116 receives a control signal 126. In various embodiments of the present invention, the common transmit signal 118 may be a single-ended Radio Frequency (RF) signal, a differential RF signal, a single-ended microwave signal, a differential microwave signal, a single-ended audio signal, or a differential audio signal.

The driver 110, the driver 112, the driver 114, and the driver 116 precondition the common transmit signal 118 to produce a transmit output signal 128, a transmit output signal 130, a transmit output signal 132, and a transmit output signal 134 respectively. Further, the transmit output signal 128, the transmit output signal 130, the transmit output signal 132, and the transmit output signal 134 are provided to the amplifying section 102, the amplifying section 104, the amplifying section 106, and the amplifying section 108 respectively.

The amplifying sections 102, 104, 106, and 108 amplify the transmit output signals 128, 130, 132, and 134 to produce an amplified transmit output signal 136, an amplified transmit output signal 138, an amplified transmit output signal 140, and an amplified transmit output signal 142 respectively. Further, the sum of the amplified transmit output signals 136, 138, 140, and 142 is provided to the output load 144. The signal shaper also shapes signals for optimal processing by delay elements.

In an embodiment of the present invention, the amplifying sections 102, 104, 106, and 108 may be amplifying sections of a Linear Amplification using Nonlinear Components (LINC) amplifier. In another embodiment of the present invention, the amplifying sections 102, 104, 106, and 108 may be amplifying sections of a Doherty style amplifier. In yet another embodiment of the present invention, the amplifying sections 102, 104, 106, and 108 may be amplifying sections of a vector combining amplifier.

Figure 2:
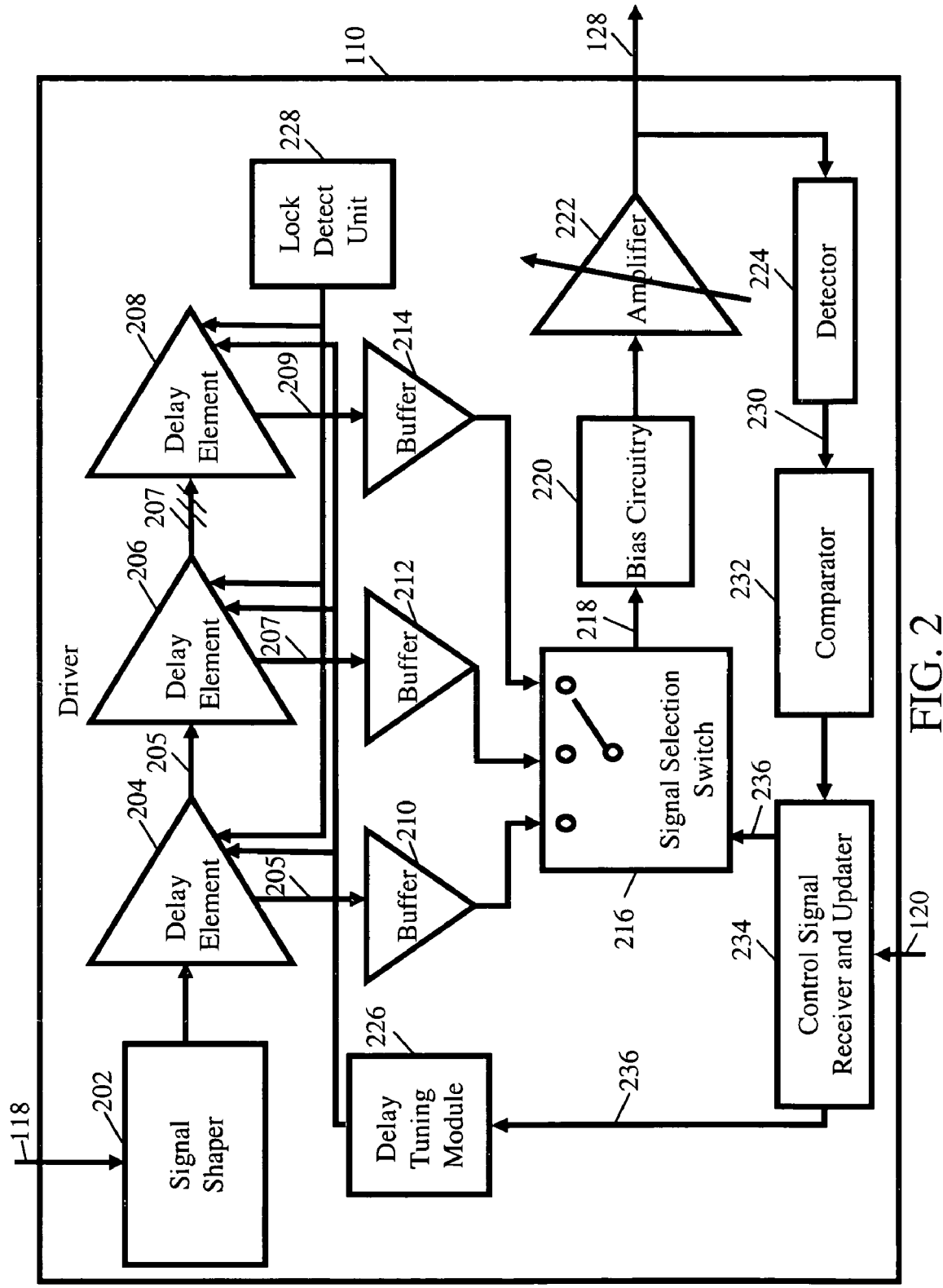
FIG. 2 is block diagram illustrating components of a driver that provides an input to an amplifying section of a distributed power amplifying system, in accordance with an embodiment of the present invention.

FIG. 2 is block diagram illustrating components of the driver 110 that provides an input to the amplifying section 102 of the distributed power amplifying system 100, in accordance with an embodiment of the present invention. The driver 110 includes a signal shaper 202, a plurality of delay elements (for example, a delay element 204, a delay element 206, and a delay element 208), a plurality of buffers (for example, a buffer 210, a buffer 212, and a buffer 214), a signal selection switch 216, a bias circuitry 220, an amplifier 222, a detector 224, a delay tuning module 226, a lock detect unit 228, a comparator 232, and a control signal receiver and updater 234.

The signal shaper 202 receives and shapes the common transmit signal 118. For example, the signal shaper 202 may shape the common transmit signal 118 by adjusting the amplitude of the common transmit signal 118. The amplitude of the common transmit signal 118 may be adjusted either by scaling its amplitude to a desired amplitude value or by replacing its amplitude by a desired amplitude value. The signal shaper 202 shapes the common transmit signal 118, to accommodate the losses suffered by the common transmit signal 118 during transmission. [For the inventor: As per our understanding, the signal shaper shapes the common transmit signal to accommodate for the losses suffered by it during transmission. Please confirm our understanding.]

After shaping, the common transmit signal 118 is provided to the delay element 204. The delay element 204 provides a predetermined phase shift to the common transmit signal 118. The information pertaining to the predetermined phase shift is provided by the control signal 120 that is provided to the control signal receiver and updater 234. The predetermined phase shift is determined on the basis of the phase of the amplifying section 102 (not shown in FIG. 2), to which the transmit output signal 128 is provided by the driver 110. The delay tuning module 226 tunes the delay elements 204, 206, and 208 on the basis of the information provided by the control signal 120, to provide the predetermined phase shift. The stability of the predetermined phase shift is detected by the lock detect unit 228. The output of the delay element 204 is a phase shifted signal 205 that is provided to the buffer 210 and the delay element 206. The delay element 206 provides the predetermined phase shift to the phase shifted signal 205. The output of the delay element 206 is a phase shifted signal 207. Further, the phase shifted signal 207 is provided to the buffer 212 and the delay element 208. The delay element 208 provides the predetermined phase shift to the phase shifted signal 207. The output of the delay element 208 is a phase shifted signal 209. Further, the phase shifted signal 209 is provided to the buffer 214. The buffer 210, the buffer 212, and the buffer 214 provide load buffering to the phase shifted signal 205, the phase shifted signal 207, and the phase shifted signal 209, respectively. The buffers 210, 212, and 214 store the phase shifted signals 205, 207, and 209, to stabilize the phase shifted signals 205, 207, and 209.

The buffers 210, 212, and 214 provide the phase shifted signals 205, 207, and 209 to the signal selection switch 216. The signal selection switch 216 selects one of the phase shifted signals 205, 207, and 209 on the basis of the control signal 120. The output of the signal selection switch 216 is a selected phase shifted signal 218. The selected phase shifted signal 218 is provided to the bias circuitry 220.

The bias circuitry 220 provides an operating voltage to the selected phase shifted signal 218. The bias circuitry 220 provides the selected phase shifted signal 218 to the amplifier 222. The operating voltage is provided so that the selected phase shifted signal 218 has an adequate voltage level to drive the amplifier 222.

The amplifier 222 amplifies the selected phase shifted signal 218 to produce the transmit output signal 128, on the basis of the control signal 120. The selected phase shifted signal 218 is amplified to accommodate losses suffered by the common transmit signal 118 in the driver 110. The amplifier 222 provides the transmit output signal 128 to the amplifying section 102 (not shown in FIG. 2) and the detector 224.

The detector 224 samples the transmit output signal 128. The output of the detector 224 is a sampled signal 230 that is provided to the comparator 232. The comparator 232 compares the amplitude and phase of the sampled signal 230 with a predetermined amplitude threshold and a predetermined phase threshold respectively. If the predetermined amplitude and the predetermined phase threshold conditions are not met, then the control signal receiver and updater 234 update the control signal 120. For example, for a 45 degree output, thresholds for delay driver 10 may be magnitude 1, phase 0°, driver 112 may be magnitude 1, phase 45°, driver 124 may be magnitude 1, phase 90°, driver 126 may be magnitude 1, phase 135° for in phase power combining. The control signal 120 is updated to produce an updated control signal 236 that is provided to the delay tuning module 226. Further, the common transmit signal 118 is preconditioned on the basis of the updated control signal 236 to provide the predetermined amplitude and the predetermined phase threshold to the transmit output signal 128.

In an embodiment of the present invention, the driver 110 has two detectors 224 and two comparators 232 to provide two transmit output signals 128 to a differential distributed power amplifying system.

Figure 3:
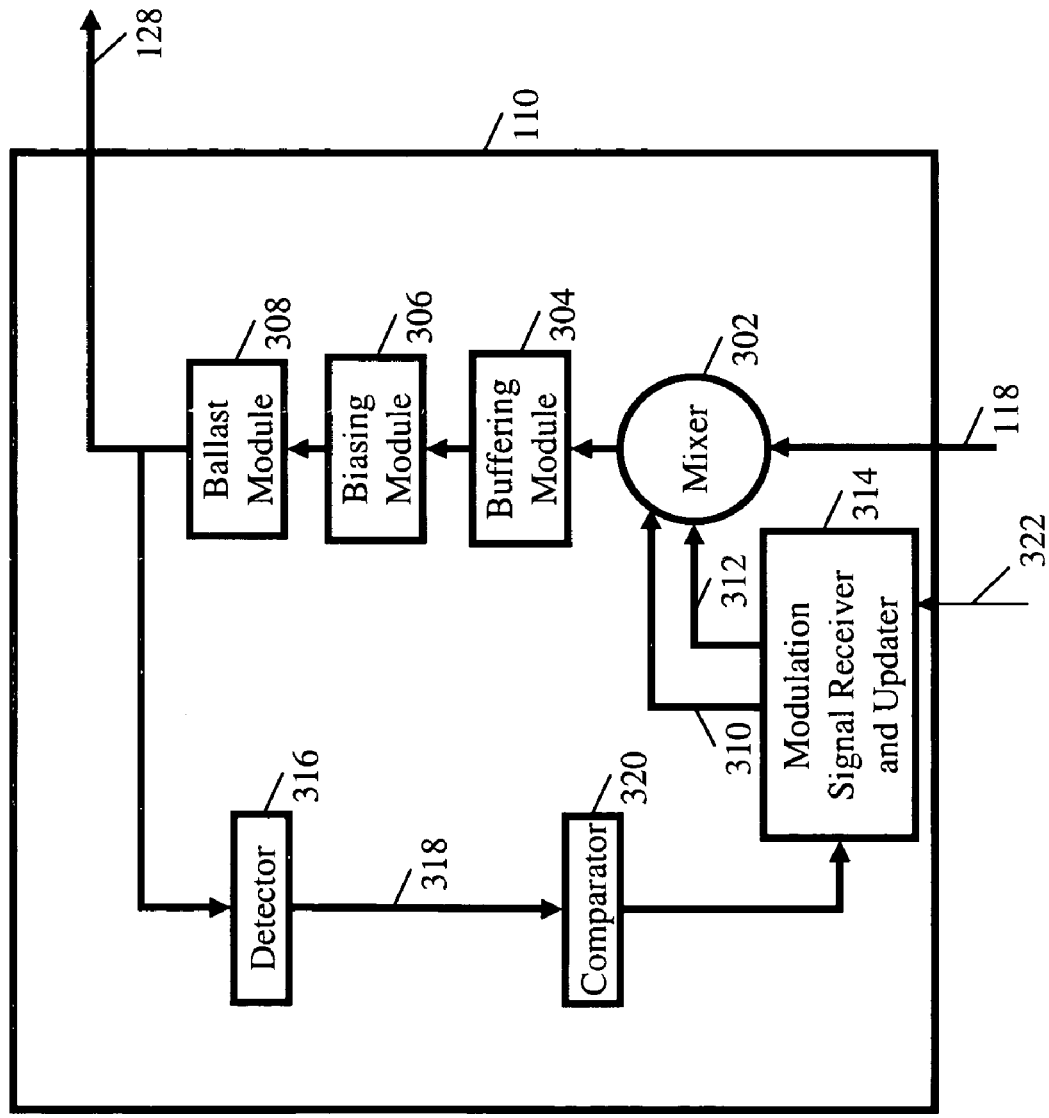
FIG. 3 is a block diagram illustrating the components of a driver that provides an input to an amplifying section of a distributed power amplifying system, in accordance with another embodiment of the present invention.

FIG. 3 is a block diagram illustrating components of the driver 110 that provides an input to the amplifying section 102 of the distributed power amplifying system 100, in accordance with another embodiment of the present invention. The driver 110 includes a mixer 302, a buffering module 304, a biasing module 306, a ballasting module 308, a modulation signal receiver and updater 314, a detector 316, and a comparator 320.

The mixer 302 receives the common transmit signal 118, a phase modulation signal 310, and an amplitude modulation signal 312. The mixer 302 receives the phase modulation signal 310 and the amplitude modulation signal 312 from the modulation signal receiver and updater 314 which is under control of control input signal 322. The mixer 302 adjusts the phase and amplitude of the common transmit signal 118. The mixer 302 adjusts the phase of the common transmit signal 118 by multiplying the common signal 118 by the phase modulation signal 310. Further, the amplitude of the common transmit signal 118 is adjusted by multiplying the common transmit signal 118 by the amplitude modulation signal 312. The output of the mixer 302 is passed to the buffering module 304.

The buffering module 304 amplifies and buffers the common transmit signal 118 to stabilize the common transmit signal 118. The current drive of the common transmit signal 118 is increased to meet the current requirement of the amplifying section 102 (not shown in FIG. 3). The output of the buffering module 304 is provided to the biasing module 306. The biasing module 306 adds bias to the incoming buffered signal to provide an operating voltage sufficient to bias the amplifying section 102 (not shown in FIG. 3). The output of the biasing module 306 is passed to the ballasting module 308. The ballasting module 308 provides protection F against current imbalance. The output of the ballasting module 308 is the transmit output signal 128. The transmit output signal 128 is provided to the amplifying section 102 and the detector 316.

The detector 316 samples the transmit output signal 128 to produce a sampled signal 318. The sampled signal 318 is provided to the comparator 320. The comparator 320 compares the amplitude of the sampled signal 318 with a predetermined amplitude threshold, and the phase of the sampled signal 318 with a predetermined phase threshold. The modulation signal receiver and updater 314 updates the phase modulation signal 310 and the amplitude modulation signal 312 if the predetermined amplitude and phase threshold conditions are not met.

Figure 4:
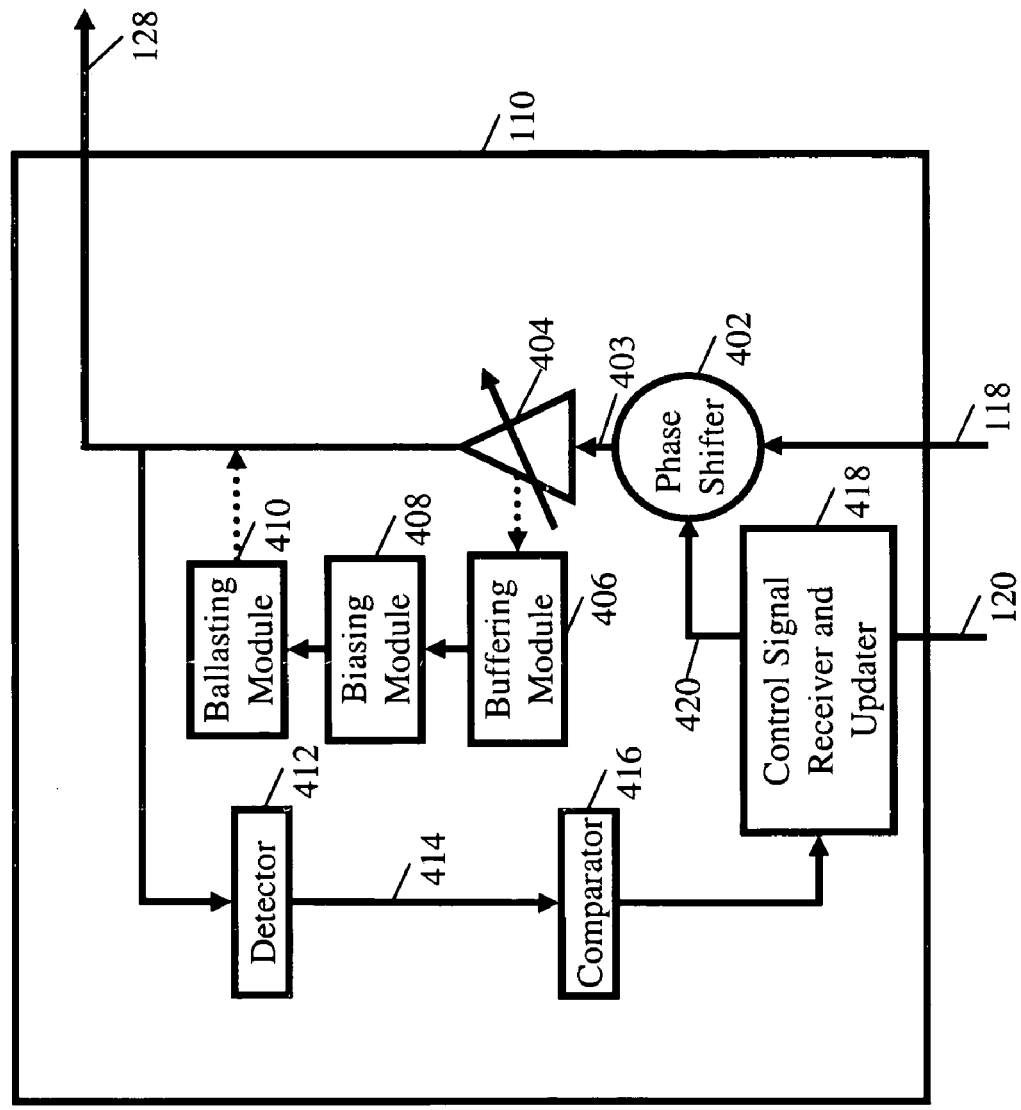
FIG. 4 is a block diagram illustrating the components of a driver that provides an input to an amplifying section of a distributed power amplifying system, in accordance with yet another embodiment of the present invention.

FIG. 4 is a block diagram illustrating components of the driver 110, in accordance with yet another embodiment of the present invention. The driver 110 includes a phase shifter 402, a gain control amplifier 404, a detector 412, a comparator 416, and a control signal receiver and updater 418.

The phase shifter 402 receives the common transmit signal 118 and the control signal 120. The phase shifter 402 receives the control signal 120 from the control signal receiver and updater 418. The phase shifter 402 shifts the phase of the common transmit signal 118 to produce a phase shifted signal 403 on the basis of the control signal 120. Further, the phase shifted signal 403 and the control signal 120 are provided to the gain control amplifier 404. The gain control amplifier 404 amplifies the phase shifted signal 403 to produce the transmit output signal 128. The gain control amplifier 404 amplifies the phase shifted signal 403 on the basis of the control signal 120. In an embodiment of the present invention, the transmit output signal 128 is provided to the amplifying section 102. In another embodiment of the present invention, the output of the gain control amplifier 404 is passed to a buffering module 406.

The buffering module 406 amplifies and buffers the common transmit signal 118 to stabilize the common transmit signal 118. The current drive of the common transmit signal 118 is increased to meet the current requirement of the amplifying section 102 (not shown in FIG. 3). The output of the buffering module 406 is provided to a biasing module 408. The biasing module 408 adds bias to the incoming buffered signal to provide an operating voltage sufficient to bias the amplifying section 102 (not shown in FIG. 3). The output of the biasing module 408 is passed to the ballasting module 410. The ballasting module 410 provides protection against current imbalance. The output of the ballasting module 410 is the transmit output signal 128. Further, the transmit output signal 128 is passed to the amplifying section 102 (not shown in FIG. 4) and the detector 412.

The detector 412 samples the transmit output signal 128 to produce a sampled signal 414. The sampled signal 414 is provided to the comparator 416. The comparator 416 compares the amplitude of the sampled signal 414 with a predetermined amplitude threshold, and the phase of the sampled signal 414 with a predetermined phase threshold, such as those given as examples earlier. Further, the control signal receiver and updater 418 updates the control signal 120 to produce an updated control signal 420 if the predetermined amplitude and phase threshold conditions are not met.

Figure 5:
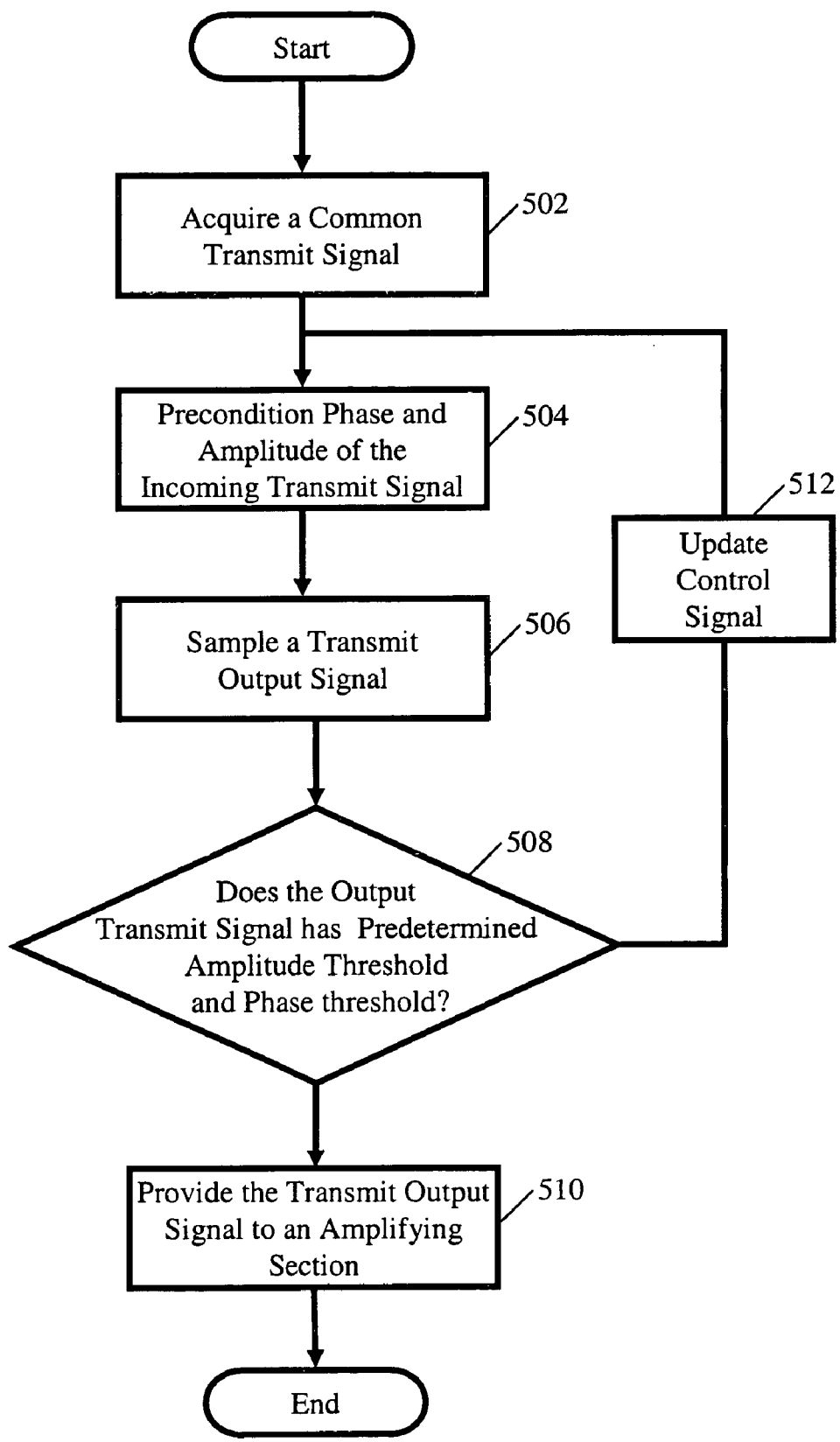
FIG. 5 is a flowchart illustrating a method for preconditioning a common transmit signal that is provided to an amplifying section of a distributed power amplifying system, in accordance with various embodiments of the present invention.

FIG. 5 is a flowchart illustrating a method for preconditioning the common transmit signal 118 that is provided to the amplifying section 102 of the distributed power amplifying system 100, in accordance with various embodiments of the present invention. At step 502, the common transmit signal 118 is acquired. In an embodiment of the present invention, the common transmit signal 118 is acquired by the driver 110. At step 504, the phase and amplitude of the common transmit signal 118 is preconditioned on the basis of a control signal 120. In an embodiment of the present invention, the phase of the common transmit signal 118 is adjusted by the delay elements 204, 206, and 208. Further, the amplitude of the common transmit signal 118 is preconditioned by the amplifier 222 to produce the transmit output signal 128. In another embodiment of the present invention, the phase and amplitude of the common transmit signal 118 is preconditioned by the mixer 302 (the output of the mixer 302 is biased, ballasted and buffered) to produce the transmit output signal 128. In yet another embodiment of the present invention, the phase of the common transmit signal 118 is adjusted by the phase shifter 402. Further, the amplitude of the common transmit signal 118 is adjusted by the control gain amplifier 404 to produce the transmit output signal 128. At step 506, the transmit output signal 128 is sampled to produce the sampled signal 230. In an embodiment of the present invention, the transmit output signal 128 is sampled by the detector 224. At step 508, the amplitude of the sampled signal 230 is compared with the predetermined amplitude threshold. Further, the phase of the sampled signal 230 is also compared with the predetermined phase threshold. In an embodiment of the present invention, the phase and amplitude of the sampled signal 230 are compared by the comparator 232. If the predetermined amplitude and phase thresholds are not met, then step 512 is performed. At step 512, the control signal 120 is updated and steps 504 to 508 are repeated. If the predetermined amplitude and phase thresholds are met, then at step 510, the transmit output signal 128 is provided to the amplifying section 102.

Various embodiments of the present invention provide a manufacturing flexibility to drivers. The manufacturing flexibility is provided by using independent drivers providing transmit output signals to amplifying sections. The number of drivers may be increased or decreased without all the drivers being changed. For example, a driver may be removed from the distributed power amplifying system if an amplifying section is not needed because of the decrease in the required amplification. Further, an extra driver may be added to the distributed power amplifying system if an extra amplifying section is needed because of an increase in the required amplification. Further, various embodiments of the present invention provide a mechanism that supplies input signals to the amplifying sections of a distributed power amplifying system from independent drivers acting as independent input sources. The input signals from the independent drivers have an uncorrelated noise component. As a result, the desired input signals are added in phase, and noise signals are not added in phase, to increase the sound to noise ratio. Further, the input signals provided by the independent drivers are conditioned to meet a predetermined phase and amplitude requirement. The conditioned input signals increase the efficiency of the amplifying sections of the distributed power amplifying system. The conditioned signal removes the termination mismatch and its ripples. The independent drivers, in accordance with various embodiments of the present invention, make input signals more unilateral. The unilateral input signal implies that the output is not looped back to the input. The distributed power amplifying system of the present invention reduces the reverse coupling effect. Reduction in reverse coupling reduces nested loops. Further, the distributed amplifying system overcomes the high-frequency limitations of the amplifying sections due to the elimination of increased input loading with increased number of sections.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A distributed power amplifying system, comprising:
a plurality of amplifying sections;
a plurality of drivers receiving a common transmit signal and an individual control signal, each of the plurality of drivers independently preconditioning the common transmit signal based on the individual control signal to provide a transmit output signal to each of the plurality of amplifying sections; and
wherein each of the plurality of drivers comprises a detector for sampling the transmit output signal to provide a sampled signal, the sampled signal being compared to a predetermined thresholds and the individual control signal being adjusted in response thereto.

2. A distributed power amplifying system, comprising:
a plurality of amplifying sections;
a plurality of drivers receiving a common transmit signal and an individual control signal, each of the plurality of drivers independently preconditioning the common transmit signal based on the individual control signal to provide a transmit output signal to each of the plurality of amplifying sections; and
wherein each of the plurality of drivers preconditions the common transmit signal using a phase shifter and a gain control amplifier.

3. A distributed power amplifying system, comprising:
a plurality of amplifying sections;
a plurality of drivers receiving a common transmit signal and an individual control signal, each of the plurality of drivers independently preconditioning the common transmit signal based on the individual control signal to provide a transmit output signal to each of the plurality of amplifying sections; and
wherein each of the plurality of drivers preconditions the common transmit signal using a mixer to adjust phase and amplitude of the common transmit signal.

4. A distributed power amplifying system, comprising:
a plurality of amplifying sections;
a plurality of drivers receiving a common transmit signal and an individual control signal, each of the plurality of drivers independently preconditioning the common transmit signal based on the individual control signal to provide a transmit output signal to each of the plurality of amplifying sections; and
wherein each of the plurality of drivers preconditions the common transmit signal using a series of selectively controlled delay elements and an amplifier.

5. A distributed power amplifying system, comprising:
a plurality of amplifying sections;
a plurality of drivers receiving a common transmit signal and an individual control signal, each of the plurality of drivers independently preconditioning the common transmit signal based on the individual control signal to provide a transmit output signal to each of the plurality of amplifying sections; and
wherein each of the plurality of drivers comprises:
a series of delay elements for shifting the phase of the common transmit signal to provide a plurality of phase shifted signals within each of the plurality of drivers;
a signal selection switch for selecting at least one of the plurality of phase shifted signals based on the individual control signal for each of the plurality drivers to provide a selected phase shifted signal; and
an amplifier for amplifying the selected phase shifted signal thereby providing the transmit output signal to one of the plurality of amplifying sections.

6. The distributed power amplifying system of claim 5 further comprising:
- a detector for sampling the transmit output signal to provide a sampled signal;
  - a comparator for comparing the amplitude and phase of the sampled signal to predetermined amplitude threshold and predetermined phase threshold;
  - a delay tuning module for tuning the delay of the series of delay elements; and
- the individual control signal being updated if the predetermined thresholds are not met and an updated control signal being provided to the signal selection switch and delay tuning module.

7. The distributed power amplifying system of claim 5, wherein each of the plurality of drivers further comprises a plurality of buffers each stabilizing each of the plurality of phase shifted signals.

8. The distributed power amplifying system of claim 5, wherein each of the plurality of drivers further comprises a lock detect unit for detecting a stable phase delay for the series of delay elements within each of the plurality of drivers.

9. The distributed power amplifying system of claim 5, wherein each of the plurality of drivers further comprises a bias circuitry to bias the selected phase shifted signal to the amplifier.

10. The distributed power amplifying system of claim 5 further comprising a signal shaper for shaping the common transmit signal.

11. The distributed power amplifying system of claim 5, wherein the common transmit signal is one of: a single-ended Radio Frequency (RF) signal, a differential RF signal, a single-ended microwave signal, a differential microwave signal, a single-ended audio signal, and a differential audio signal.

12. A method for preconditioning a common transmit signal for a distributed power amplifying system, the method comprising:
- acquiring the common transmit signal;
- preconditioning the common transmit signal using a plurality of drivers thereby providing a transmit output signal for each of the plurality of drivers, the step of preconditioning comprising the steps of phase adjusting the common transmit signal to provide a series of phase adjusted signals within each of the plurality of drivers and amplitude adjusting the selected phase adjusted signal to provide a transmit output signal for each of the plurality of drivers; and
- applying the transmit output signal from each of the plurality of drivers to an amplifying section of the distributed power amplifying system.

13. The method of claim 12 further comprising, at each of the plurality of drivers, the steps of:
- sampling the transmit output signal;
- comparing the phase and the amplitude of the sampled output signal to predetermined amplitude and phase thresholds; and
- modifying the phase and amplitude based on the predetermined amplitude and phase thresholds.

14. The method of claim 13, wherein the step of modifying the phase and amplitude is performed by updating a control signal of each of the plurality of drivers.

* * * * *